United States Patent [19]

Parker

[11] Patent Number: 4,702,563
[45] Date of Patent: * Oct. 27, 1987

[54] BATTERY TESTER INCLUDING TEXTILE SUBSTRATE

[76] Inventor: Robert Parker, 411 Rolling La., Alamo, Calif. 94507

[*] Notice: The portion of the term of this patent subsequent to Oct. 27, 2004 has been disclaimed.

[21] Appl. No.: 723,329

[22] Filed: Apr. 15, 1985

[51] Int. Cl.$^4$ .................... G02F 1/133; G01R 19/165
[52] U.S. Cl. ..................................... 350/351; 324/104
[58] Field of Search .................. 350/331 R, 341, 334, 350/336, 351, 320; 428/1; 324/435, 437, 96, 104, 106; 340/815.01

[56] References Cited

U.S. PATENT DOCUMENTS

| | | | |
|---|---|---|---|
| 2,522,660 | 9/1950 | Bledsoe | 324/437 |
| 3,454,873 | 7/1969 | Abrahams | 324/437 |
| 3,524,726 | 8/1970 | Koster | 324/106 |
| 3,600,060 | 8/1971 | Churchill et al. | 350/336 |
| 3,675,988 | 7/1972 | Soref | 324/104 |
| 3,700,306 | 10/1972 | Cartmell et al. | 350/341 |
| 3,898,354 | 8/1975 | Parker | 350/351 |
| 4,006,414 | 2/1977 | Parker | 350/351 |
| 4,022,706 | 5/1977 | Davis | 252/299.7 |
| 4,050,786 | 9/1977 | Feldman | 350/336 |
| 4,101,696 | 7/1978 | Jennen et al. | 428/1 |
| 4,235,654 | 11/1980 | Dohi et al. | 350/320 |
| 4,360,780 | 11/1982 | Skutch | 324/437 |
| 4,457,589 | 7/1984 | Tamura et al. | 350/336 |
| 4,516,836 | 5/1985 | Ferrato | 350/336 |

FOREIGN PATENT DOCUMENTS

| | | | |
|---|---|---|---|
| 0126559 | 10/1979 | Japan | 350/334 |
| 0017531 | 1/1984 | Japan | 350/33 |
| 2119110 | 11/1983 | United Kingdom | 350/334 |

OTHER PUBLICATIONS

Wargin et al, "A Large Flexible, Liquid Crystal Display Cell", IEEE Conference Record of 1972, Conference on Display Devices, N.Y., USA 11-12, Oct. 1972.

Primary Examiner—Stanley D. Miller
Assistant Examiner—David Lewis
Attorney, Agent, or Firm—Shyamala T. Rajender

[57] ABSTRACT

A device for testing a battery, particularly a small, portable battery, comprising a flexible, transparent substrate on which is deposited a narrow band of a black light absorbing material. A conductive material, which tapers outwardly in opposite directions from a central point to a pair of outer terminals, is then deposited atop the substrate on the same side of the substrate as the absorber layer. A layer of a cholesteric liquid crystal material is then deposited on the substrate on the opposite side from the black absorber layer. The conductive material is an epoxy cement-based conductor, preferably silver, printed or painted directly on to the substrate. An indicator scale is located along sections of the tapered conductive material. To test a dry cell battery, the terminal ends of the conductive material are placed in contact with the battery terminals, causing a current to flow which heats the conductive material, the heat generated being the most intense at the central point and radiating outwardly. The heat is transferred through the thin substrate to the liquid crystal layer which results in a color change in the liquid crystal. The traverse of the color change along the length of the indicator scale, outwardly from the center point, is proportional to the current or voltage output or the condition of the battery to be tested and can be read on the indicator scale which is calibrated accordingly.

37 Claims, 6 Drawing Figures

BATTERY TESTER INCLUDING TEXTILE SUBSTRATE

BACKGROUND OF THE INVENTION

This invention relates to battery testers, particularly to a tester for small, portable batteries, and more particularly to simply constructed, inexpensive tester with no moving parts, whereby a small battery can be readily tested.

The extent of the use of small batteries, particularly dry cell batteries, has increased rapidly and steadily during the last decade, and a substantial effort has been directed to the production of recharging devices for such batteries, as well as providing means for testing the strength or condition of the batteries. Batteries are often stored prior to use and in many instances are discarded for new ones without determining the existing strength or condition of the batteries, thereby resulting in a substantial waste of useful battery life.

A few battery testers and indicating devices are known in the prior art but they are bulky, cumbersome or expensive, use complex electric or electronic components and circuitry and are designed mostly for large lead-acid type batteries used in the powering of transmitters, receivers, servos and the like.

Some of these indicating devices or their components are exemplified in the following patents:

U.S. Pat. No. 4,006,414 issued Feb. 1, 1977 to Robert Parker; U.S. Pat. No. 3,974,441 issued Aug. 10, 1976 to Johannes Van Den Haak; U.S. Pat. No. 4,022,706 issued May 10, 1977 to Frederick Davis; U.S. Pat. No. 4,290,021 issued Sept. 15, 1981 to Jacob J. Theron; U.S. Pat. No. 4,066,897 issued Jan. 3, 1978 to Ralph L. Belcher; U.S. Pat. No. 3,600,060 issued Aug. 17, 1971 to Donald Churchill; and U.S. Pat. No. 4,360,780 issued Nov. 23, 1982 to William G. Skutch, Jr.

The foregoing status of the art indicates that a need has existed in this field for an inexpensive and simple device or means for readily testing the charge state or condition of batteries, such as those of the 1.5 and 9 volt dry cell types. with such a tester one could readily test batteries especially dry cell batteries before deciding to discard them and install new ones at the time of contemplated use.

SUMMARY OF THE INVENTION

The present invention fills the above mentioned need by providing an effective device for readily testing batteries such as the 1.5 and 9 volt dry cell type and which, at the same time, lends itself to simple and inexpensive means and methods of fabrication.

Therefore, it is an object of the present invention to provide a means for testing batteries, particularly, dry cell batteries.

A further object of the invention is to provide a battery tester which can be readily used by purchasers of small, portable batteries.

Another object of the invention is to provide a battery tester which basically consists of a conductive material deposited in a specific pattern on a layer of a cholesteric crystal material carried on a substrate, such that current flowing through the conductive material produces a temperature gradient, which in turn causes a color change or a line of delineation in the cholesteric liquid crystal material, the distance traversed by the color change or the length of the line being proportional to the strength of the battery.

Another object of the invention is to provide a method for fabricating a battery tester which includes depositing a cholesteric liquid crystal and a conductive material on a flexible substrate in a selected pattern, such that contact of the battery terminals by opposite end portions of the conductive material results in a color change which is an indication of the strength of the battery.

Another object of the invention is to provide a method for making a battery tester which involves depositing a light absorber material, on a flexible, transparent substrate; depositing a cholesteric liquid crystal material and a conductive material on selected portions of the absorber material on the substrate on the same side or on the opposite side of the substrate, such as to form at least one wedge or bow-tie shaped pattern of conductive material having terminal end portions; whereby contact of the terminal end portions of the conductive material with the terminals of a battery results in directing current flow through the conductive material proportional to the strength or condition of the battery or its voltage or current output.

Additional objects, advantages and novel features of the invention, together with additional features contributing thereto and advantages accruing therefrom will be apparent from the following description and the accompanying illustration of an embodiment of the invention and the description of the fabrication technique therefor, as described hereinafter. The objects and advantages of the invention may be realized and attained by means of the instrumentalities and combinations particularly pointed out in the appended claims.

In accordance with the foregoing objects of the invention, the battery tester basically consists of a flexible, preferably transparent substrate or film on which is deposited a layer of a dark, light absorbing material, and, on top of the absorber, a layer of a conductive material, such as silver, nickel or carbon in a binder base such as epoxy or urethane, in at least one wedge or bow-tie configured pattern, and which terminates in or has connected to the pattern, a pair of opposite ends or terminals for contacting the terminals of a battery, such as a dry cell battery, to be tested. A microencapsulated cholesteric liquid crystal layer is deposited on the other side of the substrate.

In one preferred embodiment, a thin film of a black, light absorbing or "backing" material is deposited on a thin, flexible, transparent substrate. The black backing material or absorber may be derived from any dark paint such as a black latex or uv curing paint. A conductive material comprising epoxy or urethane based silver, nickel or carbon granules or powder is deposited on the transparent substrate or film on top of the absorber layer, so as to form at least one wedge or bow-tie shaped pattern having terminal end portions. A layer of a microencapsulated cholesteric liquid crystal is then deposited on the other side of the substrate. when the terminal end portions of the conductive material are contacted with the terminals of a battery, a current through the conductive material, generating heat in the conductor. The heat is then transferred through the substrate to the liquid crystal causing a change in its color. The color change in the liquid crystal is rendered more readily visible or discernible by the black, light absorbing, backing material. To protect the conductive pattern, a suitable protective coating may be deposited on all areas of the pattern except the terminals or contact points. The protective material may be any uv curing paint. The preferred embodiment uses two bow-tie shaped patterns, one larger than the other, on the same film or substrate, whereby either 1.5 or 9 volt batteries may be conveniently tested using the same tester.

For testing a 9 volt battery, the adjacent terminals of the battery are placed in contact with the matching terminal ends of the smaller of the bow-tie shaped patterns, whereas conventional a 1.5 volt battery is tested by wrapping the flexible substrate around the battery such that the terminal ends of the larger of the bow-tie shaped pattern contact the opposite terminal ends of the cylindrical AAA, AA, C and D types of batteries.

When a current passes through the conductive material pattern, a temperature gradient is generated beginning at the center point of the wedge or "bow-tie" and radiates towards the terminal ends. The heat generated is transferred through the substrate to the liquid crystal layer which changes color starting at a point corresponding to the central point of the bow-tie configuration of the conductor, moving farther towards the rounded edges of the bow-tie pattern. The farther the outward displacement of the color change, the greater is the voltage output or the strength of the battery being tested. A calibrated scale, indicating a relationship between voltage or current vs. distance traveled, is located along the bow-tie pattern such that color changes in the liquid crystal corresponding to only the central section of the conductive material indicates a weak battery while color changes in the liquid crystal corresponding to a length beyond the central section and beyond or through the entire length of the pattern indicates a good to a strong battery condition.

DETAILED DESCRIPTION OF A PREFERRED EMBODIMENT

Figure 1:
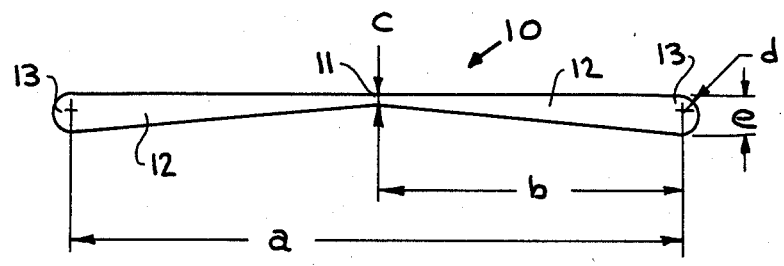
FIG. 1 illustrates a bow-tie configured member of conductive material, made in accordance with the invention, with dimensions of the various sections thereof illustrated.

The present invention involves a device for testing batteries, particularly dry cell batteries, and a method for fabricating the device. For example, it can be readily used to test batteries of the 9 volt type used in small portable calculators, radios and the like, which have two adjacent terminals or contacts. It can also be readily used in testing batteries of the 1.5 volt type such as the cylindrical AAA, AA, C or D size batteries used in flashlights, portable stereos, travel clocks and the like and which have terminals or contact points on opposite ends of the battery. Basically, the battery tester involves depositing a pattern of electrically and thermally conductive material on a substrate, the pattern being in the form or configuration of a wedge or "bow-tie" (tapering from a small central point outwardly in opposite directions) with each outer end terminating in or connected to a point of contact to which a terminal of a battery to be tested is placed in contact. The conductive material may be epoxy based silver, nickel or carbon. The tester additionally includes an absorber or backing band or strip deposited on the substrate, preferably on the same side of the substrate as the conductive pattern. A layer of a microencapsulated cholesteric liquid crystal material is deposited on the opposite side of the substrate from the absorber layer. As used herein, the terms "cholesteric liquid crystal" and "liquid crystal" are used interchangeably throughout this description and refer to the same liquid crystal materials disclosed and claimed herein. An indicator scale can also be located along the length of the "bow-tie" shaped pattern, since the liquid crystal material changes color in a direction corresponding to the length of the conductive pattern, starting at a point corresponding to the central point of the pattern. The greater the displacement of the color change from the central point, the greater is the current flow, which is proportional to the strength or condition of the battery. The dark or black backing material or backer makes the color change easily observable and may be derived from any dark paint such as a black latex or uv curing paint. Other paints or coating materials are also suitable. A suitable protective coating may be optionally applied over the "bow-tie" pattern except at the terminal ends thereof, to protect it from wear and tear, and to ensure correct placement of the tester contacts on the battery terminals.

Cholesteric liquid crystals are chosen as the indicating materials because of the brilliant iridescent colors they exhibit when exposed to changes in temperature, pressure and electric fields. Cholesteric liquid crystal materials suitable for use in the subject invention include but are not limited to cholesteryl chloride, cholesteryl oleyl carbonate, cholesteryl bromide, cholesteryl acetate, cholesteryl nanoate, cholesteryl oleate, cholesteryl caprylate, and the like. In addition, all the cholesteric liquid crystals disclosed and listed in U.S. Pat. Nos. 4,022,706 and 3,600,060 are incorporated herein by reference and made a part hereof, as being suitable for use in the subject invention.

Referring now to the drawings, FIG. 1 illustrates an embodiment of a bow-tie configured pattern 10 of conductive material composed of a layer of granular metallic silver in an epoxy based coating material. The bow-tie pattern consists of a small cross-sectional or central sectional point 11 and a pair of outwardly tapering arm sections 12 which terminate in curved ends 13 which, in turn, form an electrical contact with the terminals of a dry cell battery as described hereinafter. By way of example, the length 'a' of pattern 10 is about four (4) inches, the length 'b' being about two (2) inches and width 'c' being about 0.037 inch, the distance 'e' being about 0.225 inch, and the radius 'd' being about 0.112 inch. The configuration or pattern 10 is designed for testing a battery having terminals on opposite ends thereof, as described below.

Figure 2:
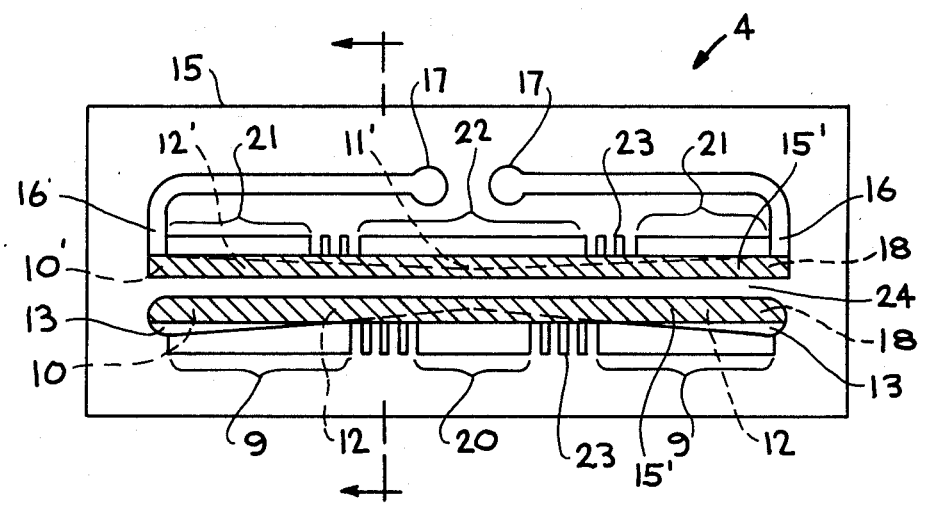
FIG. 2 illustrates a preferred embodiment of the battery tester of the subject invention.

FIG. 2 illustrates a preferred embodiment of the subject battery tester, generally indicated at 14, made in accordance with the present invention, which utilizes two separate conductive material patterns 10 and 10' which are deposited on a transparent substrate or film 15 composed, for example, of transparent, high temperature stable, film or support of polyester (such as Dupont's mylar), polycarbonate, polyamide, polysufone, paper, preferably, fiber or nylon enforced, cellulose, laminates and the like. Other high-temperature stable polymers are equally suitable.

The film 15 is preferably transparent so that the user can easily match the terminal ends or contacts 13 of the conductive pattern 10 with the terminals of the battery being tested. The film, for example, may vary in thickness from about 0.001 inch, with a preferred thickness of about 0.002 to 0.005 inch. Film of a thickness less than about 0.001 inch would be too insubstantial to be operative satisfactorily, for testing the condition of batteries, while a film thicker than about 0.010 inch would result in longer response times (because the time required for the battery tester to reach thermal equilibrium would then be greater than 5-10 seconds) and consequent loss of the observed color change.

The conductive material forming patterns 10 and 10' is deposited on the film or substrate 15 by printing, coating, painting or other conventional depositing techniques. This conductive material may be epoxy based silver, nickel or carbon and may be in the form of a conductive "ink". Silver is the most preferred conductor. Epoxy or urethane based silver, nickel or carbon and the like are the materials of choice. The conductive material, preferably, should have a resistance of about 0.1 to 0.05 ohms per square. The dimensions of the preferred "bow-tie" 10 of FIG. 2, for instance, are designed to give a pattern that will have a resistance of about 2-2.5 ohms. This is the optimum value given by the manufacturer (such as Union Carbide) of the cylindrical dry cell batteries in their manuals relating to their 1.5 volt AAA, AA, C and D size batteries. The "bow-tie" pattern 10' of FIG. 2 is designed to have a resistance of about 2.250 ohms, to test a 1.5 volt battery. The tester tests the battery under a resistive load similar to that in its normal operational uses. It was found that the tester operated best over a range of 1-5 ohms with a preferred resistance of about 2.25 ohms. In the illustrated embodiment, the ratio of the dimensions from the narrowest to the widest taper of the silver conductive material is about 6 to 1 for the "bow-tie" pattern.

Referring again to FIG. 2, the conductive pattern 10' is designed for testing a 9 volt transistor type battery (those having adjacent terminals or contacts) and includes a center pont or section 11', a par of outwardly tapering arm sections 12', a pair of circuit paths or sections 16, connected to the outer ends of arms 12', which terminate in contacts or terminal ends 17 spaced so as to coincide with the distance separating the adjacent terminals on a conventional 9 volt transistor type battery.

Figure 4:
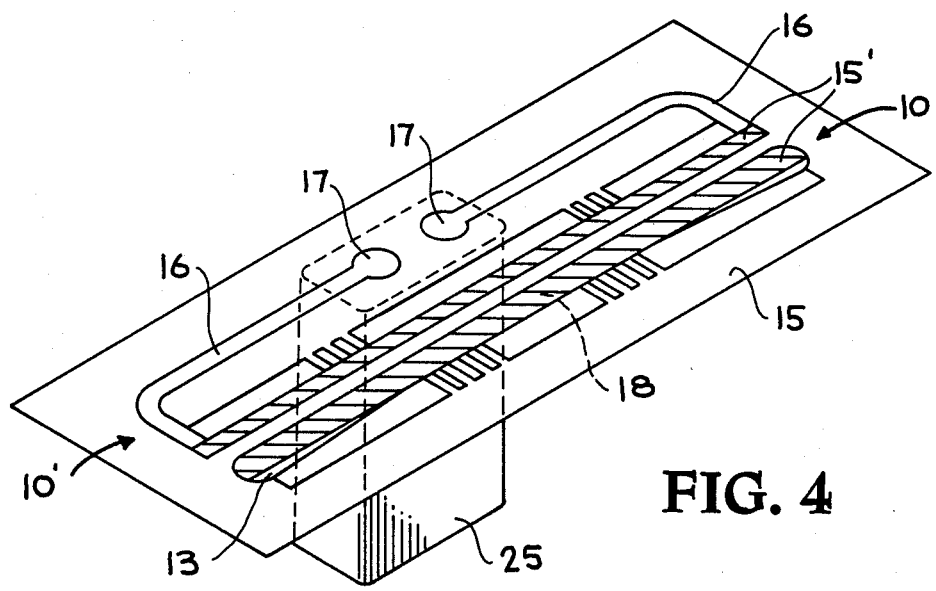
FIG. 4 illustrates the battery tester of FIG. 2 positioned to test a battery having adjacent terminals such as a 9 volt battery.
Figure 5:
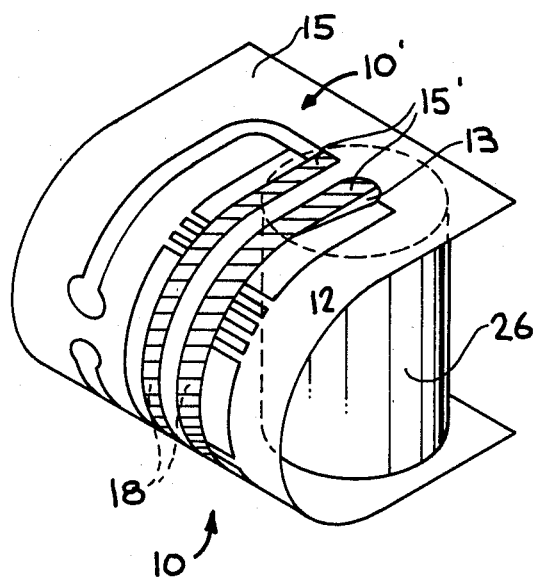
FIG. 5 illustrates the battery tester of FIG. 2 positioned to test a battery having opposite terminals such as a 1.5 volt battery.

A layer 15' of a cholesteric liquid crystal material is deposited on the side of substrate 15 opposite to that on which the conductive layer or patterns 10 and 10' are deposited. A layer or band 18 of a black light absorber or backing material or backer, such as a black latex paint, or black uv curing paint is deposited on substrate 15 on the same side as the conductive patterns 10 and 10'. The absorber or backing layer or band 18 does not extend the full length of arms 12 of the "bow-tie" pattern 10 and 10' so that the contact or terminal ends 13 extend beyond the absorber layer 18, thereby enabling the user of the tester to observe and match the contacts or terminals of the tester with the terminals of the battery being checked as illustrated in FIG. 5. Similarly, the width of the absorber or backer layer 18 does not extend to the circuit paths 16 or the terminal ends 17 of conductive pattern 10' which enables the user to observe and match the contact between terminal ends 17 and the terminals of the battery being tested, as seen in FIG. 4. Alternatively, the absorber or backer layer 18 can be deposited on the film or substrate 15, whereafter conductive patterns 10 and 10'0 are deposited onto absorber layer 18 on the substrate adjacent the absorber layer taking care that the terminal ends of the conductive patterns are not covered or superimposed by the absorber layer. The liquid crystal layer 1540 is then deposited on the opposite or other side of the substrate. Since liquid crystals transmit only about 15% of any incident light, the black light absorbing material facilitates observation and measurement of color changes in the liquid crystal material against a dark background. Although the foregoing sequential order of depositing the various components is illustrated in the preferred embodiment, this order is not critical or necessary for the operation of the tester. For instance, the conductive layer may be alternatively placed directly atop the absorber layer which is deposited on top of the liquid crystal layer, all on the same side of the substrate.

As shown in FIG. 2, substrate 15 is also provided with a plurality of scale sections or segments located adjacent the edges of absorber or backer layer 18, as indicated at 19 and 20 for conductive pattern 10 and at 21 and 22 for conductive pattern 10'. These scale segments may be deposited directly onto substrate 15. The area of the patterns 10 and 10' indicated by center scale segments 20 and 22 indicate a weak, "bad" or low battery, while the outer segments 19 and 21 indicate a strong, "good" or charged battery. For example, the center scale segments 20 and 22 may be colored red, with the outer scale segments 19 and 21 being colored green to correspond to the conventional battery test color codes. While not illustrated in the figures, scale segments 19-22 may be marked in voltage increments on an outwardly increasing scale from 0 at the center point 11-11' to the full voltage on the outer portions of arms 12 and 12' of the patterns 10 and 10' (i.e., 1.5 or 9.0, for example). While the embodiments of the scale sections illustrated in FIG. 2 include spaces indicated at 23 between adjacent scale sections (between central section 20 and each of the outer sections 19 for example) these spaces may include a separately colored portion (red and green striped or orange or red and black striped, for example) to indicate that the battery is near weak or "replace soon" condition. Furthermore, the scale sections indicated in the embodiment of FIG. 2 may be replaced with a continuous scale from center points 11 and 11' to a selected outer point on arms 12 and 12' and be marked or calibrated from 0 volts at the center point to the full voltage, such as 1.5 or 9.0, at the outer point, and if desired, the scale may be colored gradually progressing from, for example, a bright red at the center point to a bright green at the outer point.

By way of example, the components of the battery tester illustrated in FIG. 2 may have the following dimensions: the transparent flexible substrate 15 has a length of about 5 inches, width of about 2 inches, and thickness of about 0.005 inch. The absorber or backer layer or band 18 has a thickness of about 0.0002 inch, a length of about 4 inches and a width of about 0.60 inch and, if desired, may be reduced to about 0.20 inch. The liquid crystal layer 15' has a thickness of about 0.002 inch, preferably about 0.001 inch. The dimensions of the conductive layer or pattern 10 is as described in a preceding section relative to FIG. 1. The conductive layer or pattern 10' has an overall length of about 4 inches, with a width at point 11' of about 0.010 inch and a width at the outer end of each arm 12' of 0.050 inch, with the circuit paths 16 having a width of about 0.075 inch and an overall length of about 2 inches (each circuit path 16 having an L-shaped configuration with the base or foot section having a length of about 0.50 inch and the leg section having a length of about 1.5 inches) with circuit paths 16 terminating in terminal ends 17 having about a ¼ inch outer diameter. The terminal ends 17 are located about ½ inch apart. The thickness of the conductive patterns 10 and 10' is about 0.0002 inch. The scale segment 20 is about ¾ inch in length, with the segments 19 being about 1 ¼ inch in length, while the scale segment 22 is about 1 ½ inches in length, with the segment 21 being about 1 inch in length. The conductive patterns 10 and 10' are separated by a section of the absorber or backer layer 18, as indicated at 24, which has a width of about 0.10 inch. The purpose of reducing the length of the absorber or backer layer 18 is to allow for a portion of the outer section of the conductive arms 12 to be exposed (i.e., not supported or covered by the black absorber or backer material) for making electrical contact. The conductive patterns 10 and 10' may be optionally covered by an insulating protective layer. Insulating protective material may be any conventional material used for such purposes, but is preferably a uv curing ink.

While the dimensions indicated above are conveniently used in the preferred embodiments, other dimensions and shapes may be used for the conductive patterns. The two arms of the bow-tie configuration may be unequal in length and may be unsymmetrical.

While various techniques may be used to fabricate the embodiment of the battery tester illustrated in FIG. 2, the following is a description of the fabrication process or method utilized to construct the battery tester for experimental purposes for verifying the operability of the invention. The method consists of the following operational steps:

(a) forming a substrate 15 of the desired dimensions from a piece of material such as a polyester, polyamide or polycarbonate which is transparent and flexible;

(b) depositing (printing or coating) on one side of the substrate, a layer or coating 15' of a microencapsulated liquid crystal material. This may be accomplished using a template cut out to the required or desired pattern or dimensions or may be silk screen or off set printed on the substrate;

(c) depositing a layer or band 18 of a black backer or absorber material such as black latex or uv curing paint, of a desired length and width on the other or opposite side of substrate 15. This may be done using a template cut out to correspond to the desired shape and dimensions or may be silk screen or off set printed on the substrate material;

(d) depositing (printing or coating) a first layer or pattern 10 of a conductive material on top of absorber layer 18 such that it is positioned or aligned relative to the liquid crystal layer 15' and the absorber layer as shown in FIG. 2. This may be accomplished using a template cut out to correspond to the desired shape and dimensions of the conductive pattern 10. Alternatively, the conductive pattern may be deposited on the same side as the liquid crystal layer, with the absorber layer sandwiched between the pattern and the liquid crystal layer, i.e., the absorber layer is deposited over the the liquid crystal layer before the conductive pattern is deposited over the absorber layer;

(e) depositing (printing or coating) a second conductive layer or pattern 10' of the same or different conductive material as in step c above, on substrate 15 in a spaced relationship with respect to the first pattern 10 and positioned or aligned with respect to the liquid crystal layer 15' and absorber layer 18 as shown in FIG. 2. The two different conductive materials may be, for example, epoxy based silver for one pattern and epoxy based nickel or carbon for the other conductive pattern. A template cut out to correspond to the conductive pattern 10' may be used for this purpose;

(f) depositing (printing or coating) a scale 19-20, 21-22, for each of the patterns 10 and 10' on the substrate 15 adjacent and along the length of the absorber or backer layer 18. Templates with appropriate cut out patterns for the scale segments may be used;

(g) depositing (printing or coating) a protective nonconductive film 30 over the areas of the conductive patterns 10 and 10', and optionally, over the liquid crystal layer, using materials such as uv curing paints. This provides environmental and insulative protection for the patterns 10 and 10'.

In fabricating the battery tester, the above process may be modified such that the conductive patterns 10 and 10' are printed, painted or coated over the black absorber or backer layer 18 such that the terminal ends extend beyond the layer 18. In addition, the width of the absorber layer 18 may be reduced from that shown in FIG. 2 such that an outer portion of at least arms 12 of conductive pattern 10 is exposed (not covered or backed by absorber 18) so as to expose more of the silver conductive material, to increase the contact area or terminal end. The black band or absorber layer 18 may be made narrow enough to delineate a sharp vertical or horizontal line as the liquid crystal material changes color when it is heated by the conductive pattern as the current passes therethrough.

Although the preferred method of fabrication shows the foregoing sequence of steps, such sequence is neither crucial nor necessary for the operation or practice of the present invention. Alternatively, the liquid crystal, absorber, conductive patterns and the protective coating may all be located on the same side of the substrate. For instance, in one embodiment, a layer 15' of the liquid crystal is initially deposited on the substrate 15, followed by a layer 18 of the absorber. The conductive patterns 10 and 10' are then deposited on top of the absorber and then coated with the insulating protective coating.

Figure 6:
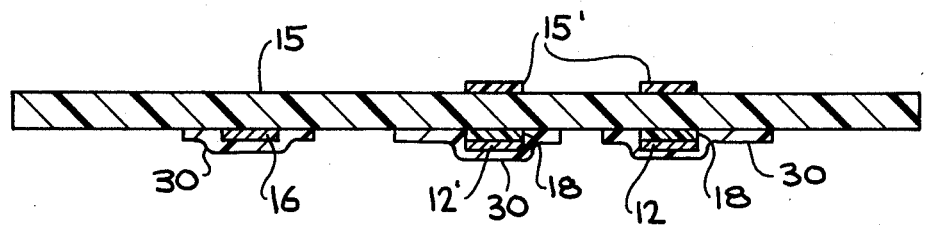
FIG. 6 illustrates a cross-sectional view through lines 6—6 of the tester of FIG. 2.

FIG. 6 shows a cross-sectional view of the preferred embodiment of the instant tester of FIG. 2, taken along lines 6-6 and shows the various layers relative to each other. Cholesteric liquid crystal layer 15' is deposited on substrate 15. The black light absorbing material 18 is layered on the substrate 15 on the side opposite from the one which carries the liquid crystal layer. Conductive layers or patterns 10 and 10' are then deposited on the absorber layer 18. A protective layer 30 is coated on the substrate to cover all portions of the conductive patterns.

The operation of the battery tester such as the embodiment thereof illustrated in FIG. 2 is described below:

1. For a battery, such as a conventional 9 volt type having both terminals on one end thereof and adjacent to each other, the terminal ends 17 of the tester are placed in physical contact with the terminals on a battery 25 to be tested at shown in FIG. 4. The completed circuit causes current to flow through conductive pattern 10' and places the battery 25 under an ideal resistive load. The current from the battery initially heats the conductive material of pattern 10' at the narrowest point 11', setting up a temperature gradient and causing a temperature rise which is transferred to the liquid crystal material, resulting in a color change in the liquid crystal material. The color change traverses outwardly along arms 12' as more current flows. Thus, the higher the voltage output of the battery, the farther the color change moves along arms 12'. With scale segments 21-22 calibrated for a 9 volt type battery, the actual charge condition of the battery can be determined.

2. For a battery such as a conventional 1.5 volt type (AAA, AA, C and D for example) with terminals located at opposite ends thereof, the flexible substrate 15 is wrapped or curved around the battery such that the terminal ends 13 are placed in physical contact with the terminals of a battery 26, as shown in FIG. 5. The resulting current flow through the conductive pattern 10 places the battery 26 under an ideal resistive load. The heating caused by the current flow results in color change in the liquid crystal material which shows up along arms 12 as described above. The strength or condition of battery 26 is readily determined from the calibrated scale segments 19-20 which correspond to the color change along arms 12 of the conductive material.

Figure 3:
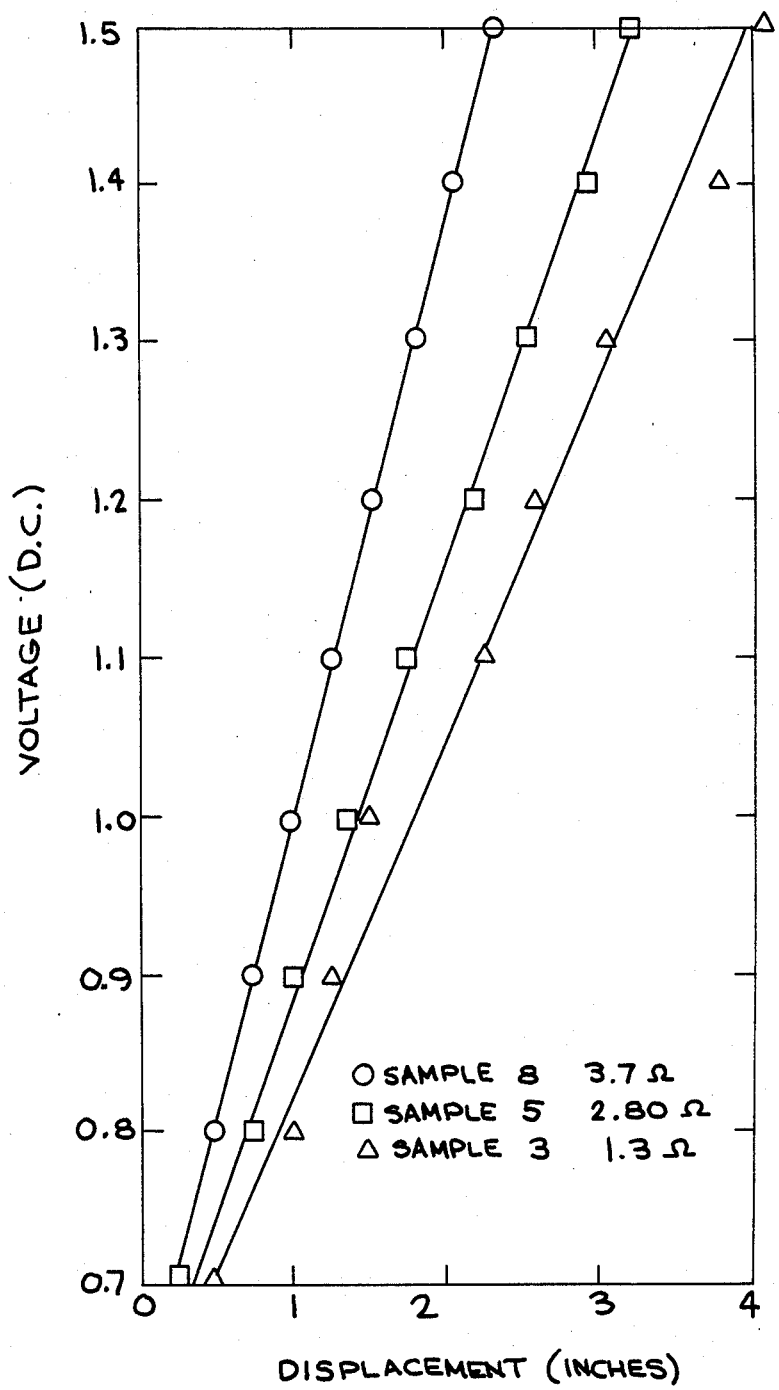
FIG. 3 is a graph showing displacement relative to voltage.

FIG. 3 graphically illustrates a typical linear relationship of voltage vs. displacement of color for various values of resistance of the exemplary conductive material used in patterns 10 and 10'. The liquid crystal material used in the embodiment described above has an onset temperature of about 43° C. This is optimum for this type of tester and should not vary by more than ±3° C. Other liquid crystal materials with different onset temperatures may be conveniently used. The graph of FIG. 3 illustrates the preferred resistance range described above and it should be recognized, of course, that the onset temperature varies with the resistive load.

Each of the arms 12 and 12' of the "bow-tie" configuration of conductive patterns 10 and 10' utilizes a straight side and two sloping or tapering sides extending outwardly from center points 11 and 11', respectively, for simplicity of construction. However, both sides of each arm 12 and 12' may be tapered, providing, of course, that the resistance per square relationship is maintained so that the overall resistance of the conductive pattern remains within the specified range. However, if a tester is to be constructed for dry cell batteries with voltages other than 9 or 1.5 volts, the dimensions of the conductive patterns would have to be modified accordingly to provide the necessary resistance to place the battery being tested under an ideal resistive load. Similarly, the scale segments extending along the length of the arms 12 and 12' would be recalibrated to correspond to the appropriate color change in the liquid crystal material and its path of traverse along arms 12 and 12', 1.5 and 9 volts may also be utilized.

While the embodiment of FIG. 2 uses a pair of conductive patterns, each including a "bow-tie" shaped section, other conductive patterns or shapes may be used provided that the correct resistance ratio is maintained along the length of the pattern. Although two conductive patterns 10 and 10' deposited on the same substrate is illustrated in the preferred embodiments, for ease and convenience of use, the subject tester is not limited to such a configuration. For instance, where only a tester for the 9 volt type battery with two adjacent terminals is desired, the substrate on which the conductive pattern is deposited need not be flexible and/or transparent so long as transparent windows or window sections are provided in the substrate to correspond with the contact terminal end sections of the conductive material or pattern of the tester so that the user can easily match tne tester terminals with the battery terminals. Only one conductive pattern, one for the 1.5 volt battery type and one for the 9 volt battery type, may be deposited each on a separate piece of substrate 15. Two conductive patterns for the same general type of batteries i.e., with terminals located at opposite ends thereof, but with different voltage capacities, may also be deposited on the same substrate piece, for example, a 1.5 volt and a 4.5 volt battery each with terminals located at opposite ends thereof as illustrated in FIG. 5. Two dissimilar conductive patterns or two dissimilar materials with different resistivities, such as silver and nickel, or silver and carbon or carbon and nickel, may also be utilized for different resistive loads and different voltages other than 1.5 and 9.

It has thus been shown that the present invention provides a device of simple construction which yet provides an effective, inexpensive, completely portable and simple means for testing the condition or voltage output of small portable batteries such as for example dry cell batteries. The invention, thus, fills the need which has existed in the art of battery testing devices.

The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A battery tester incorporating liquid crystal material which reversibly changes color proportional to the heat produced by an electric current flowing through the tester, said battery tester, said battery tester comprising:
   a flexible substrate;
   a layer of absorber material located on a portion of said substrate, and
   a layer of a cholesteric liquid crystal located on a portion of said substrate;
   at least one pattern of electrically conductive material having terminal end sections located on said substrate and in alignment with said liquid crystal layer and said absorber material layer except for said terminal end sections,
   said substrate being constructed of material of sufficient flexibility to enable said terminal end sections of said electrically conductive material to be placed in contact with the terminals of an associated battery;
   scale means having calibration markings thereon for indicating the strength of an associated battery; and whereby contact of said terminal end sections with terminals of an associated battery causes a current to flow through said conductive material which causes portions of said conductive material to heat, the heat being transferred to said liquid crystal material causing said liquid crystal material to change color proportional to the current flowing through said conductive material.

2. The battery tester of claim 1, further including a scale located on said substrate, and extending substantially parallel to at least portions of said pattern.

3. The battery tester of claim 1, wherein said pattern of conductive material includes a "bow-tie" configured area comprising a central section and a pair of outwardly extending sections, said outwardly extending sections being constructed to cooperate with said terminal end sections of said pattern.

4. The battery tester of claim 1, wherein said terminal end sections of said pattern of conductive material are positioned with respect to one another so as to be able to contact a pair of terminals on an associated battery to be tested.

5. The battery tester of claim 4, wherein said terminal end sections are positioned to contact terminals of an associated battery which are located on the same end of an associated battery.

6. The battery tester of claim 4, wherein said terminal end sections are positioned to contact terminals of an associated battery which are located on opposite ends of an associated battery.

7. The battery tester of claim 1, additionally including a protective layer located over said pattern of conductive material except for said terminal end sections.

8. The battery tester of claim 1, wherein a pair of patterns of electrically conductive material are located on said substrate and in alignment with said liquid crystal material.

9. The battery tester of claim 8, wherein each of said pair of patterns of conductive material include terminal end sections located so as to cooperate and contact terminals of different types of associated batteries.

10. The battery tester of claim 1, wherein said substrate is transparent.

11. The battery tester of claim 1, wherein said substrate is opaque and is provided with transparent window sections corresponding to said terminal end sections of said conductive material.

12. The battery tester of claim 1, wherein said substrate is transparent and flexible.

13. The battery tester of claim 12, wherein said substrate is selected from the group of materials consisting of paper and a polymer, said polymer being selected from the group consisting of polycarbonate, polysulfone, polyester, cellulose and polyamide.

14. The battery tester of claim 12, wherein wherein said cholesteric liquid crystal is selected from the group consisting of cholesteryl chloride, cholesteryl oleyl carbonate, cholesteryl bromide, cholesteryl acetate, cholesteryl nanoate, cholesteryl oleate, and cholesteryl caprylate.

15. The battery tester of claim 12 wherein said conductive material is an epoxy or urethane based conductor selected from the group consisting of silver, nickel and carbon.

16. The battery tester of claim 15 wherein said each of said conductive patterns is epoxy or urethane based silver.

17. The battery tester of claim 15 wherein one of said pair of conductive patterns is epoxy or urethane based silver and the other of said pair of conductor patterns is epoxy or urethane based nickel or carbon.

18. A tester for dry cell batteries which utilizes the response of a liquid crystal material to heat generated by current passing through said tester, said tester comprising:
a substrate constructed of flexible, transparent material and of sufficient flexibility to readily allow repeatable bending thereof;
a layer of absorber material located on said substrate;
a layer of a cholesteric liquid crystal located on said substrate;
a pair of patterns of electrically conductive material located on said substrate and positioned so as to be at least partially in alignment with said layer of liquid crystal and said layer of absorber material, each of said patterns of electrically conductive material being constructed differently and including terminal end sections located so as to be not in alignment with said layer of absorber material, said terminal end sections of one of said pair of patterns being located so as to be adapted to contact terminals of an associated battery which are located on the same end thereof, said terminal end sections of another of said pair of patterns being located so as to be adapted to contact terminals of an associated battery which are located on opposite ends thereof when said substrate is bent to allow contact of the terminal end sections with the terminals of an associated; and
scale means positioned on said substrate and extending adjacent to sections of said pattern of conductive material, said scale means having calibration markings to indicate the condition of an associated battery being tested under a resistive load.

19. The tester of claim 18, wherein said scale means includes sections of different color to indicate the charge state of an associated battery.

20. The tester of claim 18, wherein said scale means includes an indicator representing the charge of an associated battery.

21. The tester of claim 18, wherein each of said pair of patterns of conductive material includes a "bow-tie" shaped section having a central point and two outwardly extending tapered arm sections, an outer portion of each of said arm shaped section having a central point and two outwardly extending tapered arm sections, an outer portion of each of said arm sections of each pattern being connected to one of said terminal end sections of said pair of patterns.

22. The tester of claim 18, wherein said pair of patterns of conductive material are located on a side of said substrate opposite from the location of said layer of said cholesteric liquid crystal but on the same side as said layer of said absorber material.

23. The tester of claim 18, additionally including a coating of protective material located over at least a portion of said pair of patterns of conductive material other than said terminal end sections thereof.

24. The tester of claim 18, wherein said substrate is transparent.

25. The tester of claim 24, wherein said substrate is constructed of a material selected from the group of materials consisting of paper and a polymer, said polymer being selected from the group consisting of polycarbonate, polysulfone, cellulose, polyester and polyamide.

26. The tester of claim 25, wherein said liquid crystal is selected from the group consisting of cholestery chloride, cholesteryl oleyl carbonate, cholesteryl bromide, cholesteryl acetate, cholesteryl nanoate, cholestery oleate and cholesteryl caprylate.

27. The tester of claim 18, wherein said conductive material is an epoxy or urethane based conductor selected from the group consisting of silver, nickel and carbon.

28. The tester of claim 27 wherein said conductive material is epoxy or urethane based silver.

29. A tester for dry cell batteries which incorporates a liquid crystal material which reversibly changes color in response to an electrical current through said tester, said tester comprising:
   a substrate constructed of flexible, transparent polyester material capable of repeated bending thereof;
   a layer of a black uv curing paint located on one side of said substrate;
   a layer of a cholesteric liquid crystal located on the other side of said substrate;
   a pair of patterns of electrically conductive, epoxy-based silver material located on the same side of said substrate as said black uv curing paint but on the opposite side from said liquid crystal layer and positioned on top of said uv curing paint so as to be at least partially in alignment with said layer of liquid crystal and said layer of uv curing paint, each of said patterns of electrically conductive, epoxy based silver material being constructed differently and including terminal end sections located so as to be not in alignment with said layer of uv curing paint, said terminal end sections of one of said pair of patterns being located so as to be adapted to contact terminals of an associated battery which are located on the same end thereof, said terminal end sections of another of said pair of patterns being located so as to be adapted to contact terminals of an associated battery which are located on opposite ends thereof when said flexible substrate is bent to enable contact between the terminal end sections and the contact terminals of an associated battery; and
   scale means positioned on said substrate and extending adjacent to sections of said pattern of conductive, epoxy-based silver material, said scale means provided with calibration markings to indicate the charge of an assocated battery being tested.

30. A method for fabricating a battery tester comprising the steps of:
   providing a readily flexible substract capable of repeatable bending a substrate with a layer of an absorber material of a desired configuration;
   providing the substrate with a layer of a cholesteric liquid crystal material;
   providing the substrate with at least one pattern of electrically conductive material having terminal end sections so as to be at least partially aligned with the layer of absorber material said substrate being constructed of materials of sufficient flexibility to enable said terminal end sections of said electrically conductive material to be placed in contact with the terminals of an associated battery; and
   locating on the substrate an indicator scale means having calibration markings thereon which extends along a longitudinally extending portion of the pattern of conductive material.

31. The method of claim 30, further comprising the step of forming the longitudinally extending portion of the pattern of conductive material to include a section having a central point and two outwardly extending tapered arms, an outer portion of each of the arms being in contact with a terminal end section of the pattern.

32. The method of claim 34, additionally including the steps of:
   forming the substrate from flexible, transparent material; and
   providing a protective coating over at least tne longitudinally extending portion of the pattern of conductive material.

33. The method of claim 32, wherein said substrate is constructed from a material selected from the group consisting of paper and a polymer, said polymer being selected from the group consisting of polycarbonate, polysulfone, cellulose, polyester and 34. The method of claim 33, wherein said conductive material is an epoxy or urethane based conductor selected from the group consisting of silver, nickel and carbon.

35. The method of claim 34, wherein said conductive material is epoxy or urethane based silver.

36. The method of claim 35, wherein said liquid crystal is selected from the group consisting of cholesteryl chloride, cholesteryl oleyl carbonate, cholesteryl bromide, cholesteryl acetate, cholesteryl nanoate, cholesteryl oleate and cholesteryl caprylate.

37. A method for fabricating a battery tester comprising the steps of:
   providing a readily flexible polyester substrate capable of repeated bending with a layer of a black, uv curing paint of a desired configuration on one side thereof;
   providing the substrate with a layer of a cholesteric liquid crystal material on the other side thereof;
   providing the substrate with at least one pattern of electrically conductive, epoxy based silver material having terminal end sections on the same side of said substrate as said black, uv curing paint, so as to be at least partially aligned with said layer of black, uv curing paint said substrate being constructed of materials of sufficient flexibility to enable said terminal end sections of said electrically conductive material to be placed in contact with the terminals of an associated battery; and
   locating on the substrate an indicator scale means having calibration markings for indicating the strength of an associated battery which extends along a longitudinally extending portion of the pattern of conductive, epoxy based silver material.

* * * * *